United States Patent [19]
Bronner et al.

[11] Patent Number: 6,110,792
[45] Date of Patent: Aug. 29, 2000

[54] METHOD FOR MAKING DRAM CAPACITOR STRAP

[75] Inventors: Gary B. Bronner, Stormville; Carl J. Radens, LaGrangeville; Juergen Wittmann, Fishkill, all of N.Y.

[73] Assignees: International Business Machines Corporation, Armonk, N.Y.; Siemens Microelectronics, Inc., Cupertino, Calif.

[21] Appl. No.: 09/136,604

[22] Filed: Aug. 19, 1998

[51] Int. Cl.$^7$ ................................................. H01L 21/20
[52] U.S. Cl. ............................................................ 438/386
[58] Field of Search ................................. 438/386, 387, 438/388, 389, 390–92, 243

[56] References Cited

U.S. PATENT DOCUMENTS

| | | |
|---|---|---|
| 4,988,637 | 1/1991 | Dhong et al. . |
| 5,049,518 | 9/1991 | Fuse et al. . |
| 5,360,758 | 11/1994 | Bronner et al. . |
| 5,362,663 | 11/1994 | Bronner et al. . |
| 5,384,474 | 1/1995 | Park et al. . |
| 5,389,559 | 2/1995 | Hsieh . |
| 5,395,786 | 3/1995 | Hsu et al. . |
| 5,521,115 | 5/1996 | Park et al. . |
| 5,543,348 | 8/1996 | Hammerl et al. . |
| 5,571,743 | 11/1996 | Henkels et al. . |
| 5,576,566 | 11/1996 | Kenney . |
| 5,614,431 | 3/1997 | DeBrosse . |
| 5,827,765 | 10/1998 | Stengl et al. ............................. 438/243 |

OTHER PUBLICATIONS

Kenney, "Spacer–Defined Strap", IBM Technical Disclosure Bulletin, vol. 32, No. 4B, Sep. 1989, pp. 321–322.

*Primary Examiner*—Charles Bowers
*Assistant Examiner*—Craig Thompson
*Attorney, Agent, or Firm*—McGinn & Gibb, P.C.; Daryl K. Neff, Esq.

[57] ABSTRACT

A method of forming a trench capacitor comprises steps of forming a trench in a substrate, partially filling the trench with a first conductive material, lining a portion of the trench above the first conductive material with a collar material, etching the collar material to a strap depth below a top of the trench, and filling the trench with a second conductive material, wherein a portion of the second conductive material positioned between the strap depth and the top of the trench comprises a buried strap.

10 Claims, 3 Drawing Sheets

METHOD FOR MAKING DRAM CAPACITOR STRAP

BACKGROUND OF THE INVENTION

1. Field of the Invention

The present invention generally relates to the formation of an electrical connection between trench capacitors and semiconductor transistors and more specifically to an improved method of forming a buried strap to make such an electrical connection.

2. Description of the Related Art

Trench storage cells are used in dynamic random access memory (DRAM) products due to the high degree of planarity obtainable with the trench structure during chip processing. One of the challenges associated with trench DRAM processing is the formation of an electrical connection between the trench capacitor and the diffusion region of the array device pass transistor.

Conventionally, as shown in FIG. 1F, a "buried strap" 120 connection is made between the top of the trench 100 and the diffusion region (i.e., drain 134) of the transistor 130. The buried strap 120 connection eliminates the requirement for a distinct lithographic patterning level. However, multiple polysilicon deposition, planarization, and etch recess steps are required to form the buried strap 120.

More specifically, the conventional process of forming a buried strap is illustrated in FIGS. 1A–1F. FIG. 1A illustrates a trench 100 which is formed in a substrate 101 and a pad silicon nitride 104 by conventional means such as photolithography and dry etching using a mixture of gases which may include $Cl_2$, Hbr, $O_2$, $N_2$, and $NF_3$ to a depth of 2 $\mu$m–1.5 $\mu$m below the pad nitride using dry etching and a mixture of gasses which may include $SF_6$, $CF_4$, $O_2$, and $N_2$. Then a collar dielectric oxide 103 (such as silicon dioxide or silicon oxynitride) is deposited over the pad nitride 104 and trench 100.

As shown in FIG. 1B, the collar oxide is etched in an anisotropic dry etch process such as reactive ion etching (RIE) using a mixture of gases which may include some portions of CHF3, Ar, 02, C4F8, and CO. The anisotropic dry etch, or sidewall spacer etch, removes material in a vertical direction at a high rate, but removes material in the horizontal direction at a relatively low rate. Therefore, the high selectivity anisotropic spacer etch will leave material along the sidewall of the trenches, and remove material from the horizontal surfaces.

As shown in FIG. 1C, the trench is then filled with a second level of polysilicon 110. The second level of polysilicon is then recessed to a depth of 0.1 $\mu$m to 0.5 $\mu$m using a dry etch. Then, as shown in FIG. 1D, the collar oxide is etched down to the level of the second level of polysilicon 110 using a wet etch such as Hf.

A third level of polysilicon 120 is deposited and the structure is planarized and recessed below the pad nitride 104 using a dry etch process, as shown in FIG. 1E. The third level of polysilicon 120 becomes the strap which contacts the diffusion area of the transistor.

The structure shown in FIG. 1E is formed in conjunction with a transistor 130, such as a metal oxide semiconductor field effect transistor (MOSFET), which is illustrated in FIG. 1F. More specifically, the transistor includes a gate 131, a gate oxide 132, a source region 133, a drain region 134 and shallow trench isolation (STI) region 135. The process of forming the transistor 130 is well known to those ordinarily skilled in the art and will not be discussed herein for the sake of brevity.

The third level of polysilicon 120 comprises a strap and forms an electrical connection between the first and second layers of polysilicon 102, 110 and the drain 134 of the transistor 130. This type of strap is known as a buried strap because it exists below the top surface of the substrate 101. By utilizing such a buried strap, the size of the semiconductor device can be reduced and, since an external strap is not required, the chance of damage to other structures within the semiconductor device is also reduced.

However, as explained above, at least three polysilicon deposition and etching steps are required with the conventional process. This increases the cost of producing such a structure. Further, because of the multiplicity of steps required, the chance for error or contamination increases with each additional processing step. Therefore, the defect rate of the conventional process is excessive. Therefore, there is a long felt need to reduce the complexity, and cost, of the process used to manufacture the buried strap connection between the trench capacitor and the transistor.

SUMMARY OF THE INVENTION

It is therefore an object of the present invention to provide a structure and method for producing a buried strap with a more simplified process than the conventional process.

The invention overetches the collar oxide to eliminate an entire layer of polysilicon. More specifically, the invention overetches the collar oxide prior to the deposition of the second polysilicon layer, which permits the entire upper portion of the trench to be filled with the second polysilicon layer. Therefore, with the invention, the second polysilicon layer contacts the drain region of the semiconductor device.

More specifically, the invention includes a method of forming a trench capacitor and semiconductor transistor structure comprising steps of forming a trench in a substrate, partially filling the trench with a first conductive material, lining a portion of the trench above the first conductive material with a collar material, etching the collar material to a strap depth below a top of the trench, filling the trench with a second conductive material, wherein a portion of the second conductive material positioned between the strap depth and the top of the trench comprises a buried strap, forming a semiconductor transistor having a diffusion region, and connecting the buried strap to the diffusion region of the semiconductor transistor.

The buried strap electrically connects the first conductive material and the second conductive material to the diffusion region of the semiconductor transistor. The step of forming the trench comprises a step of etching the substrate to provide dimensions for a deep trench capacitor. The step of etching the collar material comprises a step of anisotropic dry reactive ion etching of the collar material. The substrate comprises a silicon substrate, the collar material comprises a collar oxide, the first conductive material comprises polysilicon and the second conductive material comprises polysilicon.

The invention also includes a semiconductor device comprising a substrate having a trench, the trench having a lower section and an upper section, a first conductive layer positioned in the lower section of the trench, a second conductive layer positioned above the first conductive layer in the upper section of the trench, the second conductive layer having a strap section and a collar section below the strap section, a collar layer positioned between the trench and the collar section of the second conductive layer, a semiconductor transistor connected to the strap section of the second conductive layer, wherein the strap portion of the second conductive layer comprises a buried strap.

The second conductive layer comprises a monolithic, homogeneous structure. The semiconductor transistor includes a diffusion region, the buried strap electrically connecting the second conductive layer to the diffusion region. The first conductive layer and the second conductive layer comprise polysilicon, and the collar material comprises a collar oxide. The first conductive layer is electrically connected to the second conductive layer.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 2A:
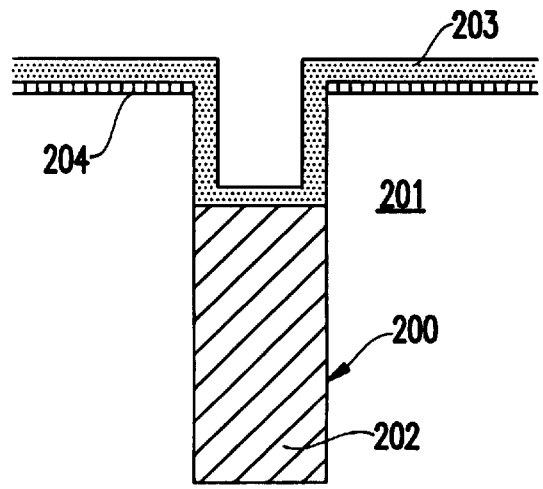
FIGS. 2A–2D illustrate an inventive process for forming a capacitor strap.
Figure 2B:
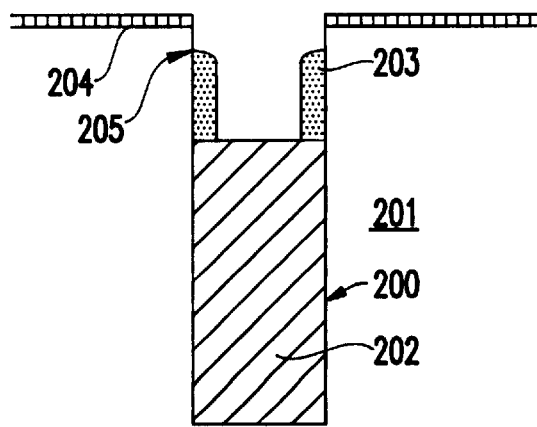

Referring now to the drawings, and more particularly to FIG. 2A, a trench 200, formed in a substrate 201 is illustrated. The substrate, 201, is preferably a silicon substrate. The trench 200 is a deep trench capacitor in this example. However, the invention is not limited to deep trenches capacitor, but could include any type of similar trench.

As discussed above, the trench 200 can initially be lined with a dielectric insulating layer. Then, the trench is partially filled with a first layer of conductive material 202 which is preferably polysilicon, but could also comprise metal or any other conductive material and a pad nitride 204, such as silicon nitride, is formed. As is known by one ordinarily skilled in the art, the trench 200 is formed by conventional processes including lithography, mask etching, mask removal, wet cleaning. Similarly, the formation of the first layer of conductive material 202 can include low-pressure chemical vapor deposition (LPCVD) dry polysilicon etching and planarization and recessing any dielectric with wet and dry stripping (from the upper portion of the trench). Preferably, the first layer of conductive material 202 fills approximately 85% of the deep trench 200.

Figure 1A:
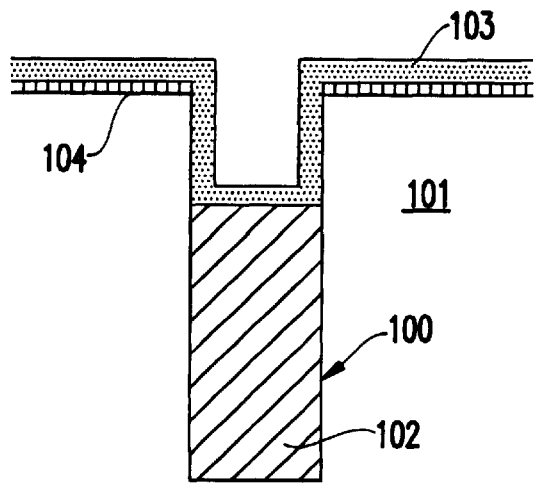
FIGS. 1A–1F illustrate a conventional process for forming a capacitor strap.
Figure 1B:
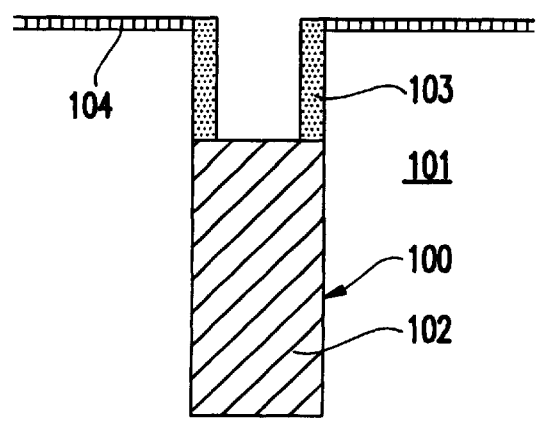

A collar oxide 203 is deposited over the top of the substrate 201, along the walls of the trench 200, and above the first layer of conductive material 202. The collar oxide is a dielectric and could comprise silicon dioxide, silicon oxynitride or other similar dielectric materials. The resulting structure shown in FIG. 2A is substantially similar to the structure illustrated in FIG. 1A, which is discussed above.

Figure 1C:
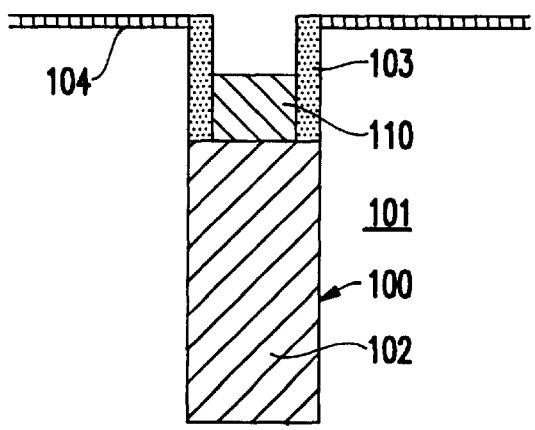
Figure 1D:
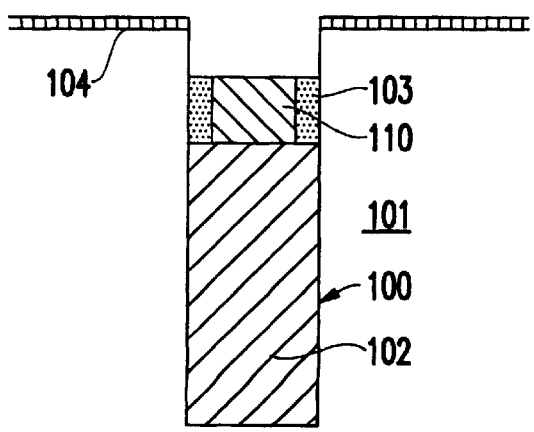

The collar oxide 203 is etched in, for example an anisotropic dry reactive ion etch (RIE), as discussed above with respect to FIG. 1C. Such an RIE could use a mixture of gases which may include some portions of $C_3F_8$, $C_2F_6$, He, $CHF_3$, Ar, $O_2$, $C_4F_8$, and CO. The anisotropic dry etch, or sidewall spacer etch, removes material in a vertical direction at a high rate, but removes material in the horizontal direction at a relatively low rate.

However, unlike the conventional process, with the invention, the collar oxide is overetched to strap depth 205 such that the collar oxide 203 remains only on the walls of the trench 200 up to the point that would normally represents the top of the conventional second layer of polysilicon 110, discussed above (e.g., 95% of the depth of the trench). The strap depth 205 is chosen to be fraction of the depth of the subsequent device isolation depth (such as shallow-trench isolation 235). It must also be deeper than the subsequent recess depth of the conventional second layer of polysilicon 210, to assure electrical continuity of the strap.

In addition, the dry etch process condition may be chosen to provide etch rate selectivity between the collar oxide 204, and the pad nitride 204 film to minimize pad nitride 203 erosion.

Subsequently, the remainder of the trench 200 is completely filled with a second level of conductive material 210. Once again, the conductive material could comprise polysilicon, metal or any other similar conductive material. The first conductive material 202 may or may not be the same as the second level of conductive material 210. The second level of conductive material 210 is recessed below the pad nitride 204 using, for example, a dry etch process. The depth of this recess is preferably 10–50 nm and provides electric isolation from regions of gate conductor formed during subsequent processing.

Figure 1E:
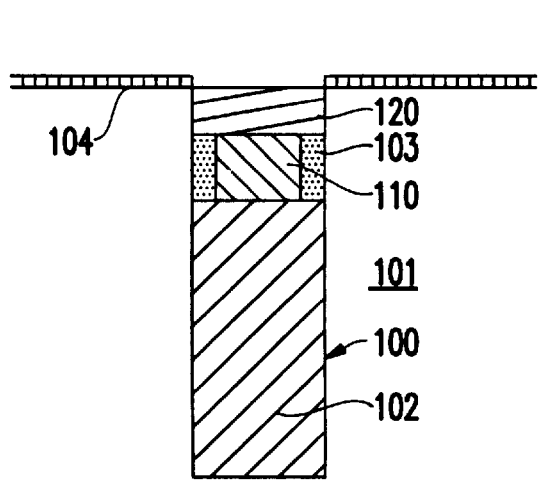
Figure 2C:
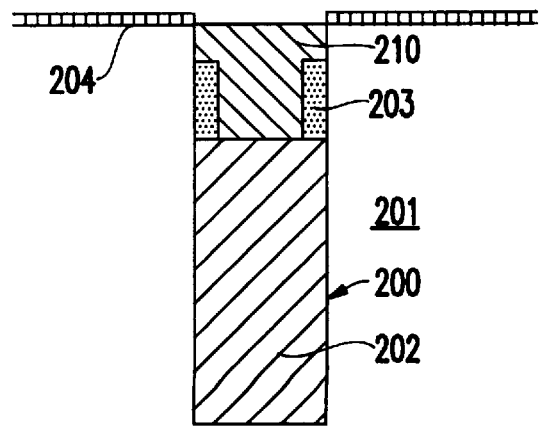
Figure 1F:
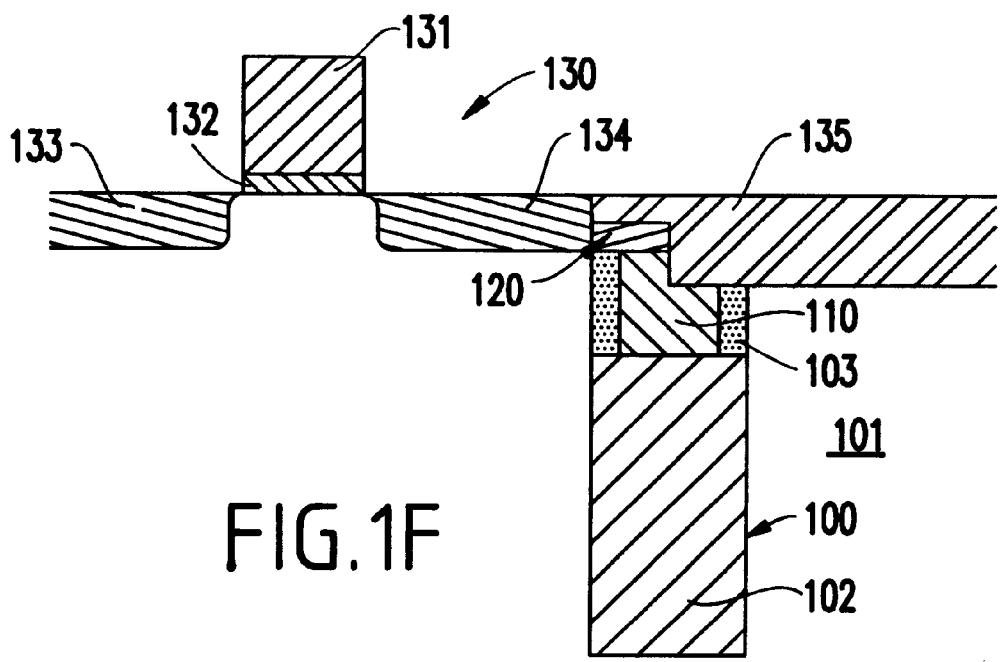

The structure illustrated in FIG. 2C is functionally equivalent to the conventional structure illustrated in FIG. 1E. However, since only two conductive layer deposition and etching steps are required with the invention, the invention is substantially less expensive and simpler to produce than the conventional structure.

Figure 2D:
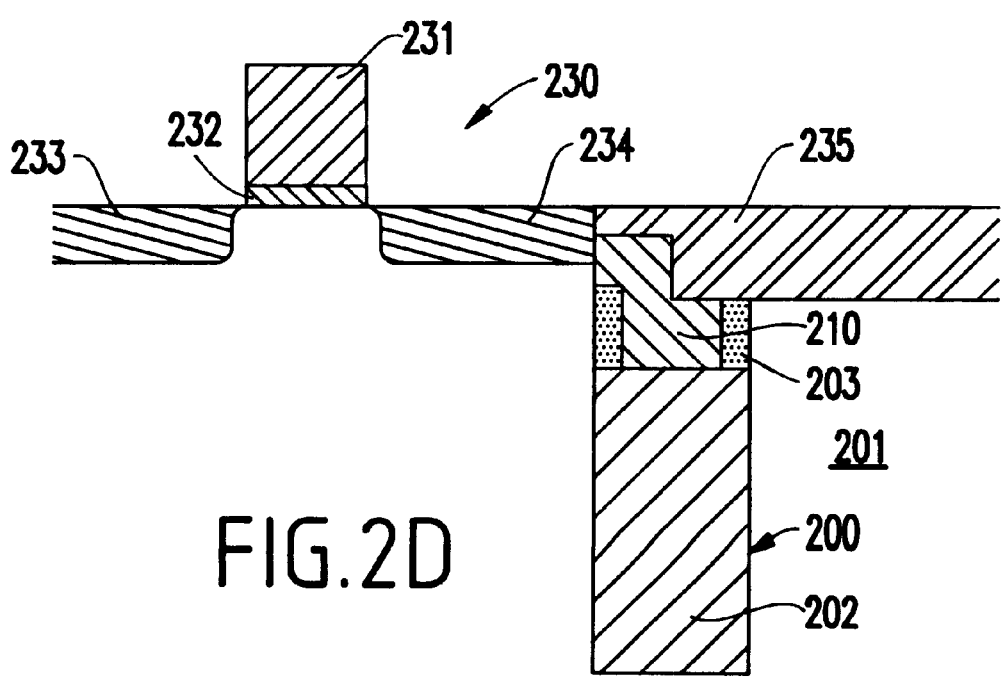

As with the structure discussed above shown in FIG. 1E, the deep trench 200 illustrated in FIG. 2C is formed in conjunction with a transistor 230, such as a MOSFET transistor, illustrated in FIG. 2D. More specifically, the transistor 230 includes a gate 231, gate oxide 232, drain region 233, source region 234 and shallow trench isolation region 235.

As shown in FIG. 2D, the second conductive layer comprises a buried strap and forms an electrical connection between the deep trench capacitor 200 and a diffusion region of the transistor (e.g., the drain region 234). Once again, the specific components making up the transistor 230 and the methods of forming the same all are well known to those ordinarily skilled in the art and are not discussed herein for the sake of brevity and clarity.

While in the example illustrated in FIGS. 2A–2D, a deep trench capacitor (such as a dynamic random access memory (DRAM) is illustrated, the invention is equally applicable to shallow trench devices, as well as any other similarly situated components.

Therefore, as shown above, the inventive process is substantially simpler than the conventional process and is, therefore, faster, less expensive and produces less defects when compared to the conventional process.

While the invention has been described in terms of preferred embodiments, those skilled in the art will recognize that the invention can be practiced with modification within the spirit and scope of the appended claims.

We claim:

1. A method of forming a trench capacitor comprising steps of:

forming a trench in a substrate;

partially filling said trench with a first conductive material;

lining a portion of said trench above said first conductive material with a collar material;

etching said collar material to a strap depth below a top of said trench; and filling said trench with a second conductive material, wherein a portion of said second conductive material positioned between said strap depth and said top of said trench comprises a buried strap.

2. The method as in claim 1, wherein said buried strap electrically connects said first conductive material and said second conductive material to a diffusion region of a semiconductor transistor.

3. They method as in claim 1, wherein said step of forming said trench comprises a step of etching said substrate to provide dimensions for a deep trench capacitor.

4. The method as in claim 1, wherein said step of etching said collar material comprises a step of anisotropic dry reactive ion etching of said collar material.

5. The method as in claim 1, wherein said substrate comprises a silicon substrate, said collar material comprises a collar oxide, said first conductive material comprises polysilicon and said second conductive material comprises polysilicon.

6. A method of forming a trench capacitor and semiconductor transistor structure comprising steps of:

forming a trench in a substrate;

partially filling said trench with a first conductive material;

lining a portion of said trench above said first conductive material with a collar material;

etching said collar material to a strap depth below a top of said trench;

filling said trench with a second conductive material, wherein a portion of said second conductive material positioned between said strap depth and said top of said trench comprises a buried strap;

forming a semiconductor transistor having a diffusion region; and connecting said buried strap to said diffusion region of said semiconductor transistor.

7. The method as in claim 6, wherein said buried strap electrically connects said first conductive material and said second conductive material to said diffusion region of said semiconductor transistor.

8. They method as in claim 6, wherein said step of forming said trench comprises a step of etching said substrate to provide dimensions for a deep trench capacitor.

9. The method as in claim 6, wherein said step of etching said collar material comprises a step of anisotropic dry reactive ion etching of said collar material.

10. The method as in claim 6, wherein said substrate comprises a silicon substrate, said collar material comprises a collar oxide, said first conductive material comprises polysilicon and said second conductive material comprises polysilicon.

* * * * *